US011633753B2

(12) United States Patent
Abe et al.

(10) Patent No.: US 11,633,753 B2
(45) Date of Patent: Apr. 25, 2023

(54) NOZZLE INSTALLATION JIG

(71) Applicant: KOKUSAI ELECTRIC CORPORATION, Tokyo (JP)

(72) Inventors: Yoshitaka Abe, Toyama (JP); Nobuhito Shima, Toyama (JP); Hiromi Okada, Toyama (JP); Shinya Morita, Toyama (JP); Mamoru Ohishi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 299 days.

(21) Appl. No.: 17/143,704

(22) Filed: Jan. 7, 2021

(65) Prior Publication Data

US 2021/0252544 A1    Aug. 19, 2021

(30) Foreign Application Priority Data

Feb. 14, 2020    (JP) .............................. JP2020-023868

(51) Int. Cl.
*B05B 15/65* (2018.01)
*F16L 27/08* (2006.01)
*C23C 16/455* (2006.01)

(52) U.S. Cl.
CPC ........ *B05B 15/65* (2018.02); *C23C 16/45563* (2013.01); *F16L 27/0845* (2013.01); *F16L 2201/10* (2013.01)

(58) Field of Classification Search
CPC .............. B05B 15/65; C23C 16/45563; F16L 27/0845; F16L 2201/10
USPC ...................................................... 239/600
See application file for complete search history.

(56) References Cited

U.S. PATENT DOCUMENTS

| 4,613,078 A * | 9/1986 | Marshall ................. B05B 15/65 |
| | | 239/600 |
| 5,402,939 A * | 4/1995 | Shank, Jr. ................. B24C 5/04 |
| | | 239/600 |
| 9,745,659 B1 * | 8/2017 | Cho ................... C23C 16/45585 |
| 2019/0256974 A1 | 8/2019 | Ohno et al. |
| 2022/0186368 A1 * | 6/2022 | Morikawa ............. C23C 16/405 |

FOREIGN PATENT DOCUMENTS

| JP | 2009-224504 A | 10/2009 |
| JP | 2012-151386 A | 8/2012 |
| JP | 2013-187459 A | 9/2013 |

(Continued)

OTHER PUBLICATIONS

Chinese Office Action dated Nov. 30, 2022 for Chinese Patent Application No. 202011531133.3.

*Primary Examiner* — Steven J Ganey
(74) *Attorney, Agent, or Firm* — Volpe Koenig

(57) ABSTRACT

Described herein is a technique capable of properly attaching a nozzle to a reaction tube. According to one aspect thereof, there is provided a nozzle installation jig including: a lower plate configured to make contact with a process vessel in a vicinity of a lower end opening of the process vessel in which a nozzle is provided; a frame fixed to the lower plate and extending upward with respect to the lower plate; an upper plate fixed to the frame and provided with a sensor configured to detect a position of the nozzle in the process vessel; and a notification device configured to transmit a notification to an operator according to a detection result of the sensor.

16 Claims, 9 Drawing Sheets

(56) References Cited

FOREIGN PATENT DOCUMENTS

| | | |
|---|---|---|
| JP | 2013-191695 A | 9/2013 |
| JP | 2014-165429 A | 9/2014 |
| JP | 2015-151574 A | 8/2015 |
| JP | 2017-045922 A | 3/2017 |
| JP | 2019-145655 A | 8/2019 |

* cited by examiner

NOZZLE INSTALLATION JIG

CROSS-REFERENCE TO RELATED PATENT APPLICATION

This non-provisional U.S. patent application claims priority under 35 U.S.C. § 119 of Japanese Patent Application No. 2020-023868, filed on Feb. 14, 2020, in the Japanese Patent Office, the entire contents of which are hereby incorporated by reference.

1. Field

The present disclosure relates to a nozzle installation jig.

2. Description of the Related Art

In a method of manufacturing a semiconductor integrated circuit device (hereinafter, also simply referred to as an "IC"), according to some related arts, a substrate processing apparatus capable forming a film on a semiconductor wafer (hereinafter, also simply referred to as a "wafer") on which the IC is manufactured may be used. In the substrate processing apparatus, after a boat accommodating a plurality of wafers therein is transferred into a process chamber by a boat elevator, a gas is supplied into the process chamber through a gas supply pipe and a nozzle.

For example, the nozzle is made of quartz. The nozzle is formed by joining a vertical portion thereof with a horizontal portion thereof in an L shape. An end portion of the horizontal portion of the nozzle made of quartz is inserted into a manifold made of a metal such as stainless steel. Then, a metal joint is fixed to a portion around the inserted portion of the nozzle by using a fastener such as a screw.

However, it is difficult to check a state of an upper portion of the nozzle, and it takes time to set up the nozzle so that the nozzle does not come into contact with the boat.

SUMMARY

Described herein is a technique capable of properly attaching a nozzle to a reaction tube.

According to one aspect of the technique of the present disclosure, there is provided a nozzle installation jig including: a lower plate configured to make contact with a process vessel in a vicinity of a lower end opening of the process vessel in which a nozzle is provided; a frame fixed to the lower plate and extending upward with respect to the lower plate; an upper plate fixed to the frame and provided with a sensor configured to detect a position of the nozzle in the process vessel; and a notification device configured to transmit a notification to an operator according to a detection result of the sensor.

DETAILED DESCRIPTION

Embodiments

Hereinafter, one or more embodiments (hereinafter, simply referred to as "embodiments") according to the technique of the present disclosure will be described with reference to the drawings.

Figure 1:
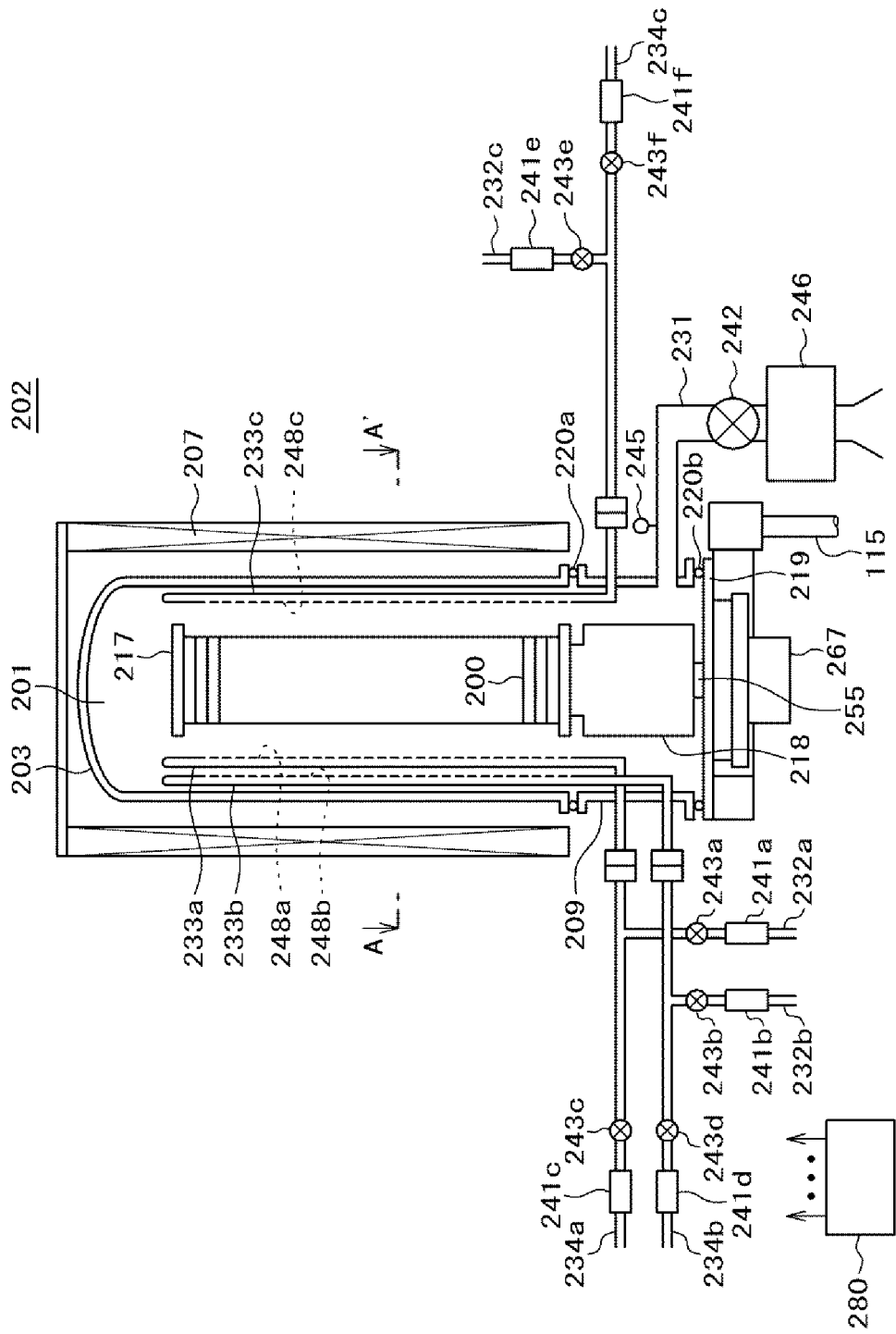
FIG. 1 schematically illustrates a vertical cross-section of a vertical type process furnace of a substrate processing apparatus preferably used in one or more embodiments described herein.
Figure 2:
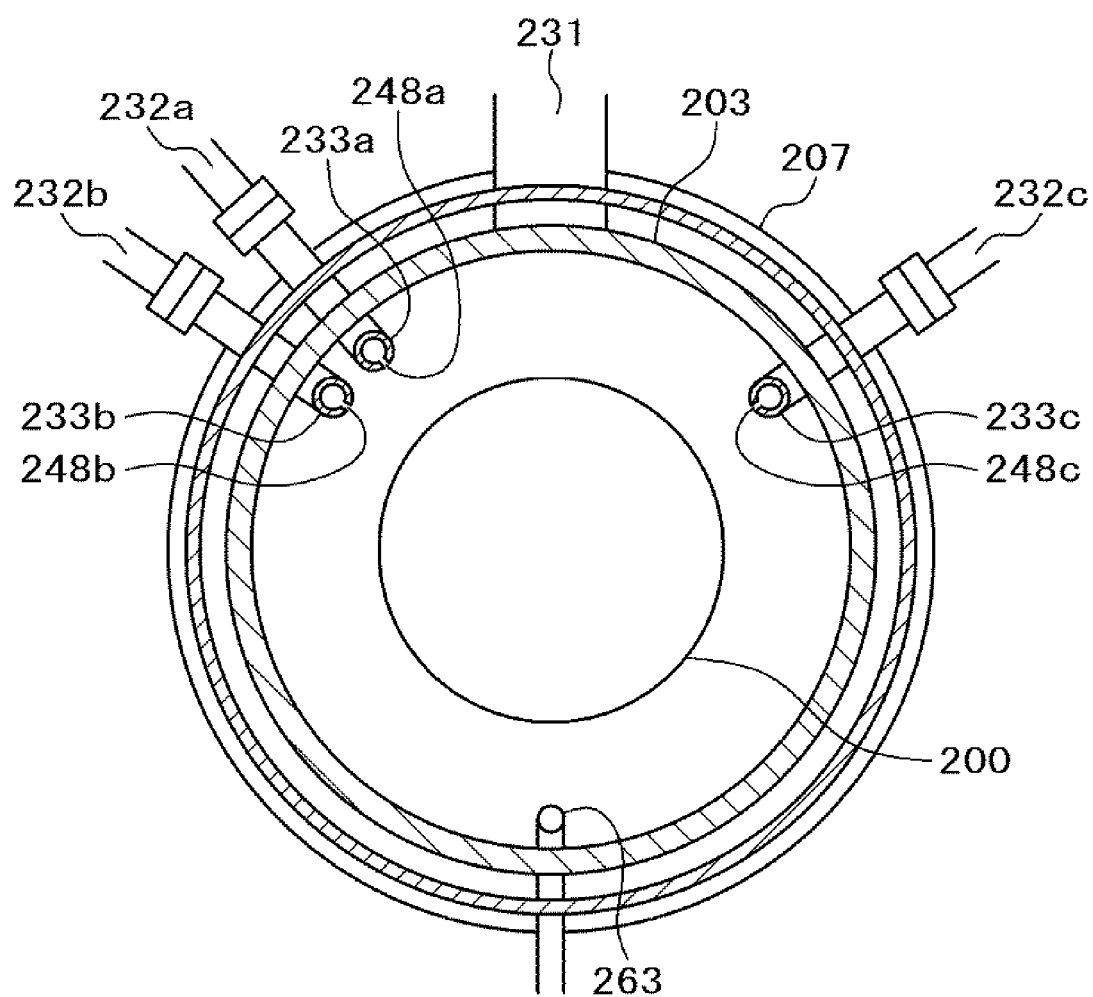
FIG. 2 schematically illustrates a horizontal cross-section taken along the line A-A' of the vertical type process furnace of the substrate processing apparatus preferably used in the embodiments shown in FIG. 1.

As shown in FIG. 1, a process furnace 202 of a substrate processing apparatus preferably used in the embodiments includes a reaction tube 203. For example, the reaction tube 203 is made of a heat resistant material such as quartz ($SiO_2$) and silicon carbide (SiC). The reaction tube 203 is of a cylindrical shape with an open lower end and a closed upper end. A process chamber 201 is provided in the reaction tube 203. The process chamber 201 is configured to accommodate a boat 217 capable of holding a plurality of wafers including a wafer 200 serving as a substrate vertically arranged in a horizontal orientation in a multistage manner. Hereinafter, the plurality of the wafers including the wafer 200 may also be simply referred to as the wafers 200.

A heater 207 serving as a heating apparatus (heating structure) is provided on an outer circumference of the reaction tube 203. The heater 207 is of a cylindrical shape, and is vertically installed while being supported by a heater base 413 (shown in FIG. 3).

A manifold 209 is provided under the reaction tube 203 so as to be concentric with the reaction tube 203. For example, the manifold 209 is made of a metal such as stainless steel (SUS), and is of a cylindrical shape with open upper and lower ends. An upper flange and a lower flange are provided at the upper end and the lower end of the manifold 209, respectively. The upper flange is engaged with the reaction tube 203 so as to support the reaction tube 203. An O-ring 220a serving as a seal is provided between the manifold 209 and the reaction tube 203. As the manifold 209 is connected to the heater base 413 in a hanging state by a hanging support (not shown), the reaction tube 203 is installed vertically so as to be concentric with the heater 207. A reaction vessel (also referred to as a "process vessel") is constituted mainly by the reaction tube 203 and the manifold 209.

A first nozzle 233a serving as a first gas introduction structure, a second nozzle 233b serving as a second gas introduction structure, and a third nozzle 233c serving as a third gas introduction structure are provided at the manifold 209 so as to penetrate a side wall of the manifold 209. Vertical portions of the first nozzle 233a, the second nozzle 233b and the third nozzle 233c are installed in a space of an arc shape between an inner wall of the reaction tube 203 constituting the process chamber 201 and the wafers 200 accommodated in the process chamber 201 so as to extend from a lower portion to an upper portion of the inner wall of the reaction tube 203 along a stacking direction of the wafers 200. Each of the first nozzle 233a, the second nozzle 233b and the third nozzle 233c is provided with a plurality of gas supply holes (also referred to as "gas supply holes") 248a on a side surface thereof. The gas supply holes 248a serve as supply holes configured to supply gases such as process gases described later.

A first gas supply pipe 232a, a second gas supply pipe 232b and a third gas supply pipe 232c are connected to the first nozzle 233a, the second nozzle 233b and the third nozzle 233c, respectively. That is, the three gas supply pipes 232a, 232b and 232c serving as gas supply paths are provided in the process chamber 201 such that various gases (for example, three types of the process gases) can be supplied into the process chamber 201 through the three gas supply pipes 232a, 232b and 232c.

A mass flow controller 241a serving as a flow rate controller (flow rate control structure) and a valve 243a serving as an opening/closing valve are sequentially installed at the first gas supply pipe 232a from an upstream side to a downstream side of the first gas supply pipe 232a. A first inert gas supply pipe 234a configured to supply an inert gas is connected to the first gas supply pipe 232a at a downstream side of the valve 243a. A mass flow controller 241c serving as a flow rate controller (flow rate control structure) and a valve 243c serving as an opening/closing valve are sequentially installed at the first inert gas supply pipe 234a from an upstream side to a downstream side of the first inert gas supply pipe 234a. The first nozzle 233a describe above is connected to a front end (tip) of the first gas supply pipe 232a.

Similarly, a mass flow controller 241b and a valve 243b are sequentially installed at the second gas supply pipe 232b. A second inert gas supply pipe 234b is connected to the second gas supply pipe 232b at a downstream side of the valve 243b. A mass flow controller 241d and a valve 243d are sequentially installed at the second inert gas supply pipe 234b.

Similarly, a mass flow controller 241e and a valve 243e are sequentially installed at the third gas supply pipe 232c. A third inert gas supply pipe 234c is connected to the third gas supply pipe 232c at a downstream side of the valve 243e. A mass flow controller 241f and a valve 243f are sequentially installed at the third inert gas supply pipe 234c.

For example, a gas supply source (for example, a cylinder) configured to supply a gas containing an oxygen atom (also referred to as an "oxygen-containing gas") may be connected to the first gas supply pipe 232a.

For example, a gas supply source (for example, a cylinder) configured to supply a gas containing a hydrogen atom (also referred to as a "hydrogen-containing gas") may be connected to the second gas supply pipe 232b.

For example, a gas supply source (for example, a cylinder) configured to supply a source gas such as a gas containing a silicon atom (also referred to as a "silicon-containing gas") may be connected to the third gas supply pipe 232c. For example, hexachlorodisilane ($Si_2Cl_6$, abbreviated as HCDS) gas may be used as the source gas.

In addition, the reaction tube 203 may further include one or more nozzle chambers (not shown) formed by projecting a part of a side portion of the reaction tube 203 to the outside thereof. Hereinafter, the one or more nozzle chambers may also simply referred to as "nozzle chambers". When the reaction tube 203 includes the nozzle chambers, the first nozzle 233a, the second nozzle 233b and the third nozzle 233c may be arranged in the nozzle chambers, respectively.

An exhaust pipe 231 configured to exhaust an inner atmosphere of the process chamber 201 is provided at the manifold 209. A vacuum pump 246 serving as a vacuum exhaust apparatus is connected to the exhaust pipe 231 through a pressure sensor 245 and an APC (Automatic Pressure Controller) valve 242. The pressure sensor 245 serves as a pressure detector and the APC valve 242 serves as a pressure regulator (pressure controller). The APC valve 242 may be embodied by an opening/closing valve. The APC valve 242 may be opened or closed to vacuum-exhaust the process chamber 201 or stop the vacuum exhaust, and an opening degree of the APC valve 242 may be adjusted in order to adjust an inner pressure of the process chamber 201. That is, with the vacuum pump 246 in operation, by adjusting the opening degree of the APC valve 242 based on a pressure detected by the pressure sensor 245, the process chamber 201 is vacuum-exhausted in order to control (adjust) the inner pressure of the process chamber 201 to a predetermined pressure (vacuum degree). An exhaust system is constituted mainly by the exhaust pipe 231, the pressure sensor 245, the APC valve 242 and the vacuum pump 246.

A seal cap 219 serving as a furnace opening lid capable of airtightly sealing a lower end opening of the manifold 209 is provided under the manifold 209. The seal cap 219 is in contact with the lower flange of the manifold 209 from thereunder. An O-ring 220b serving as a seal is provided on an upper surface of the seal cap 219 so as to be in contact with the lower flange of the manifold 209. A rotator 267 configured to support and to rotate the boat 217 serving as a substrate retainer described later is provided under the seal cap 219 opposite to the process chamber 201. A rotating shaft 255 of the rotator 267 is connected to the boat 217 through the seal cap 219. A boat elevator 115 is provided outside the reaction tube 203 vertically. The seal cap 219 may be elevated or lowered in the vertical direction by the boat elevator 115.

For example, the boat 217 serving as a substrate retainer is made of a heat resistant material such as quartz and silicon carbide. The boat 217 is configured to support the wafers 200 in a multistage manner, while the wafers 200 are horizontally oriented with their centers aligned with each other. An insulating structure 218 may be provided under the boat 217. For example, the insulating structure 218 is made of a heat resistant material such as quartz and silicon carbide. A temperature sensor 263 serving as a temperature detector is provided in the reaction tube 203. Similar to the first nozzle 233a, the second nozzle 233b and the third nozzle 233c, the temperature sensor 263 may be installed along the inner wall of the reaction tube 203.

A controller 280 serving as a control device (control structure) is configured to control components of the substrate processing apparatus.

Subsequently, the relationship between a furnace opening box 412, the first nozzle 233a, and the first gas supply pipe 232a will be described with reference to FIG. 3.

An upstream side (base) of the first nozzle 233a connected to the first gas supply pipe 232a is of an L shape, and a horizontal portion of the first nozzle 233a horizontally penetrates the side wall of the manifold 209. An O-ring 416 is provided between the horizontal portion of the first nozzle 233a and the side wall of the manifold 209 to ensure the airtightness in the process chamber 201. For example, according to the embodiments, a nozzle port 210 of a tubular shape extending radially from the side wall of the manifold 209 is provided. An inner diameter of the nozzle port 210 is slightly greater than an outer diameter of the horizontal portion of the first nozzle 233a. The first gas supply pipe 232a is inserted into the nozzle port 210 while the O-ring 416 is provided between the first gas supply pipe 232a and the first nozzle 233a.

The upstream side of the first nozzle 233a protrudes outward from the side wall of the manifold 209, and is airtightly coupled to a joint 415 provided at a downstream end of the first gas supply pipe 232a. A downstream end of the first nozzle 233a is bent vertically upward in the reaction tube 203.

Since the first nozzle 233a is heated by the heater 207, the first nozzle 233a is made of a heat resistant material (for example, a non-metallic material such as quartz and silicon carbide). The upstream side (which is a base) of the first nozzle 233a may be made of a metal such as a nickel alloy.

A nozzle tilt adjusting structure is provided below the bent portion of the first nozzle 233a. The nozzle tilt adjusting structure may include: a pedestal (also referred to as a "bracket") 421 provided on an inner wall of the manifold 209; and a tilt adjusting screw 422 that vertically penetrates a screw hole provided in the pedestal 421. By adjusting a height of the tilt adjusting screw 422 and bringing an upper end of the tilt adjusting screw 422 into contact with the bent portion of the first nozzle 233a from thereunder, it is possible to adjust a tilt of the first nozzle 233a or distances between the gas supply holes 248a of the first nozzle 233a and the wafers 200. In addition, the bent portion of the first nozzle 233a which the tilt adjusting screw 422 contacts may be made of a metal, and a base of a block shape may be provided at the bent portion.

The furnace opening box (also referred to as a "scavenger") 412 is provided on an outer circumference of the side wall of the manifold 209 and below the heater 207. The furnace opening box 412 is constituted mainly by a furnace opening box wall 423 and an exhaust port 424. The furnace opening box wall 423 refers to a wall surrounding the outside of the manifold 209 with the heater base 413, and the exhaust port 424 is configured to exhaust an inner atmosphere of the furnace opening box 412. A hole or an explicit intake port is provided on the furnace opening box wall 423. Components such as the first gas supply pipe 232a may penetrate the hole or the explicit intake port. The furnace opening box wall 423 and the first gas supply pipe 232a may not be airtightly fixed. The first gas supply pipe 232a is provided so as to be movable in an axial direction of the nozzle port 210 by bending the upstream side of the first gas supply pipe 232a.

The furnace opening box 412 is configured to locally capture the gas leakage that occurs at components such as the joint 415. The leaked gas is exhausted through the exhaust port 424 together with the air introduced through components such as the intake port, and is processed by an detoxification apparatus provided outside the substrate processing apparatus. The furnace opening box 412 may be exhausted while an inner atmosphere thereof is isolated. Therefore, an inner pressure of the furnace opening box 412 may be set to almost atmospheric pressure.

The joint 415 is accommodated in the furnace opening box 412. As shown in FIG. 3, the joint 415 is provided so as to cover an upstream end of the first nozzle 233a and the downstream end of the first gas supply pipe 232a. The joint 415 is made of a metal, and is fixed so that the first nozzle 233a and the first gas supply pipe 232a can communicate with each other. For example, the joint 415 according to the present embodiments is provided on the first gas supply pipe 232a. The joint 415 is of a shape corresponding to the first nozzle 233a, which is fitted thereto, or an engaging portion 211 of the nozzle port 210, and is configured to be removable. When fixing the joint 415, a fastener such as a screw (not shown) may be used.

Figure 3:
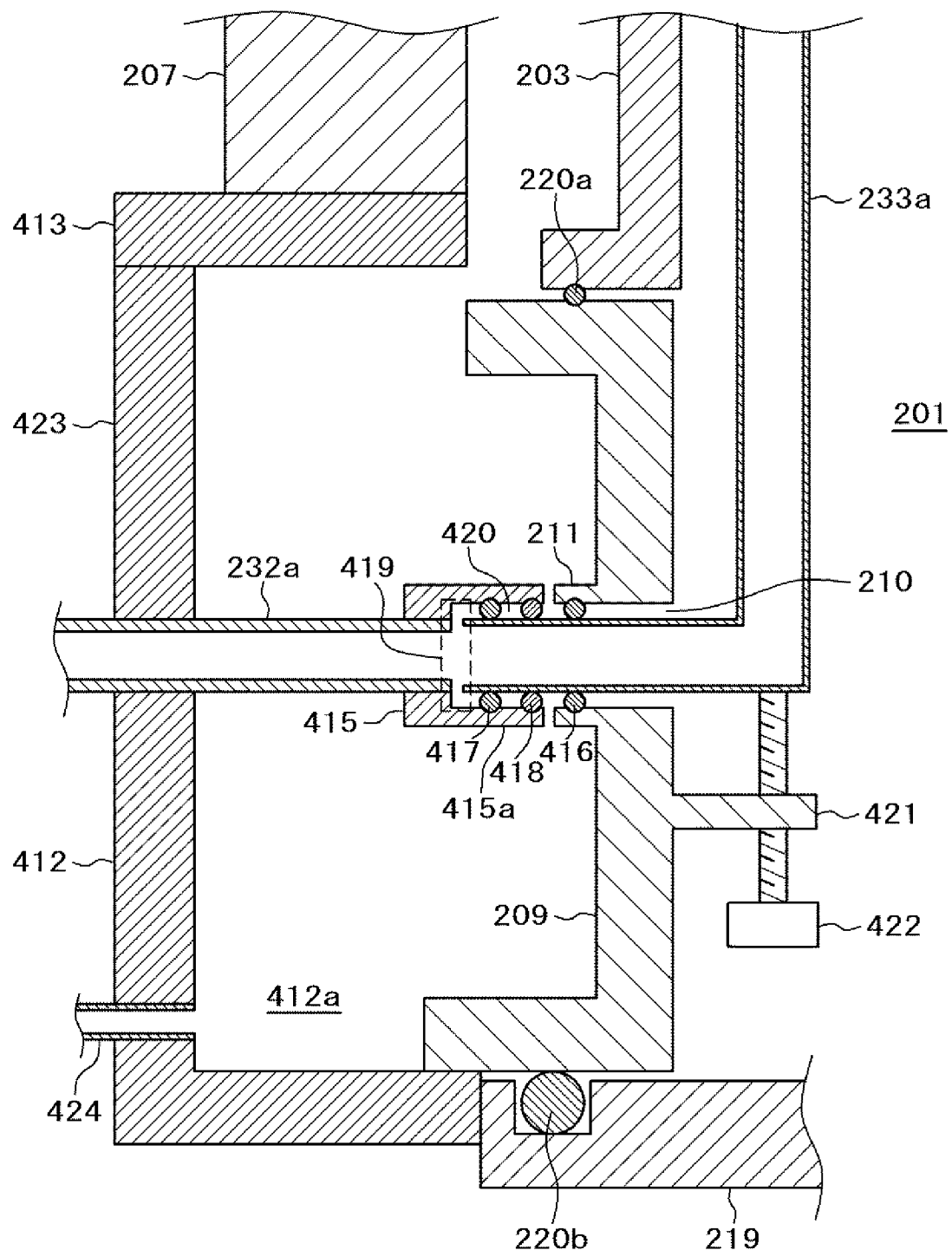
FIG. 3 schematically illustrates a joint and its peripheral structure preferably used in the embodiments.

In FIG. 3, for convenience of explanation, a combination of the first nozzle 233a and the first gas supply pipe 232a is shown. However, a combination of the second nozzle 233b and the second gas supply pipe 232b and a combination of the third nozzle 233c and the third gas supply pipe 232c may be the same as the configuration shown in FIG. 3. However, the embodiments are not limited thereto. For example, only one combination among the combinations described above is configured as shown in FIG. 3.

Subsequently, a structure of the joint 415 and its peripheral structure will be described. The first nozzle 233a is attached to the nozzle port 210 via the O-ring 416. The downstream end of the first gas supply pipe 232a is disposed to face the upstream end of the first nozzle 233a. A material of the first gas supply pipe 232a is selected in consideration of a corrosion resistance to the gas to be conveyed through the first gas supply pipe 232a. For example, the first gas supply pipe 232a is made of the material such as stainless steel.

The first nozzle 233a and the first gas supply pipe 232a are adjacent to each other with a gap therebetween. In the present specification, a space including the gap described above is referred to as an "adjacent portion 419". The gap is configured to prevent the first nozzle 233a and the first gas supply pipe 232a from generating particles by coming into contact with each other. The gap is also configured to reduce differences in the thermal expansion of components such as the first nozzle 233a and the first gas supply pipe 232a.

Since the first gas supply pipe 232a is made of a metal, the first gas supply pipe 232a can be easily and airtightly connected to the joint 415 made of a metal by bonding such as welding. The joint 415 airtightly connects an inner peripheral surface thereof and an outer peripheral surface of the first nozzle 233a via O-rings 417 and 418. The O-rings 416, 417 and 418 are made of a seal material such as fluorine-based rubber whose heat resistance and corrosion resistance are excellent.

The joint 415 and the nozzle port 210 are mechanically fixed by using a well-known fastener (not shown) such as a flange or a union nut (bag nut). The fastener described above aligns central axes of the first nozzle 233a and the first gas supply pipe 232a, and restrains the joint 415 and the engaging portion 211 of the nozzle port 210. When the joint 415 and the nozzle port 210 are fixed, the O-rings 417 and 418 are pressed against each other by a component such as a ferrule (not shown). As a result, the first nozzle 233a is also fastened.

The O-ring 418 is provided between a flange 415a and the first nozzle 233a. The O-ring 418 is also provided between the nozzle port 210 and the O-ring 417. The O-ring 418 may come into contact with the atmosphere. A pressure adjustment space 420 is provided between the O-ring 417 and the O-ring 418. In the present specification, the pressure adjustment space 420 refers to a space surrounded mainly by an outer wall of the first nozzle 233a, the flange 415a, the O-ring 417 and the O-ring 418.

Since the pressure adjustment space 420 is isolated from the adjacent portion 419 and the process chamber 201, the pressure adjustment space 420 is less affected by a pressure fluctuation in the process chamber 201 when a substrate processing is performed in the process chamber 201. That is, it is possible to disperse and reduce the pressure fluctuation and the influence caused by the pressure fluctuation using the O-rings 417 and 418. Alternatively, when focusing on an unfavorable predetermined gas (for example, oxygen), it is possible to disperse and reduce an oxygen concentration difference (gradient) using the O-rings 417 and 418 so as to reduce an amount of the oxygen permeation. The pressure adjustment space 420 is not limited to a sealed space. For example, the pressure adjustment space 420 may be purged with a gas (for example, pure nitrogen) without containing a predetermined gas. In some cases, an inner pressure of the pressure adjustment space 420 may be maintained at a pressure approximately the same as an inner pressure of a space 412a of the furnace opening box 412. When the pressure adjustment space 420 and the space 412a are at approximately the same pressure, it is possible to suppress a flow of atmospheric components from the space 412a to the pressure adjustment space 420. Since oxygen components do not flow in the pressure adjustment space 420, it is possible to suppress the atmospheric components from flowing into the adjacent portion 419.

Hereinafter, a method of installing the nozzle such as the first nozzle 233a of the substrate processing apparatus according to the present embodiments will be described with reference to FIGS. 4A through 6B.

Figure 4A:
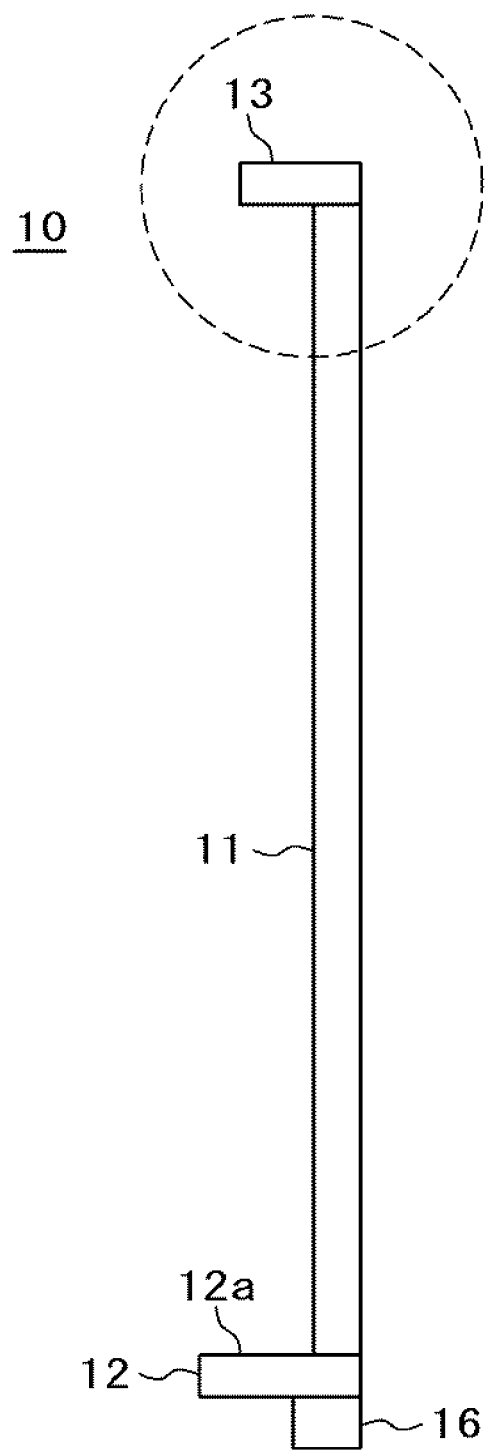
FIGS. 4A and 4B schematically illustrate a nozzle installation jig according to the embodiments described herein, where FIG. 4A schematically illustrates a side view of the nozzle installation jig and FIG. 4B schematically illustrates an enlarged view inside a broken line circle shown in FIG. 4A.
Figure 4B:
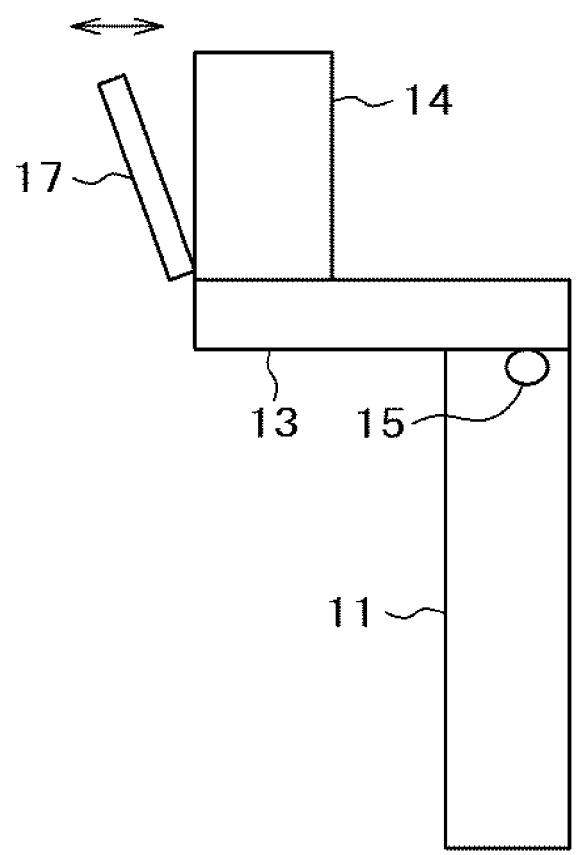

In the method of installing the nozzle according to the present embodiments, a nozzle installation jig 10 shown in FIGS. 4A and 4B is used. The nozzle installation jig 10 is used for each of the first nozzle 233a, the second nozzle 233b and the third nozzle 233c. However, since the configuration and the operation of the nozzle installation jig 10 are the same in principle for each of the first nozzle 233a, the second nozzle 233b and the third nozzle 233c, for convenience of explanation, the embodiments will be described by way of an example in which the nozzle installation jig 10 is used for installing the first nozzle 233a.

As shown in FIGS. 4A and 4B, the nozzle installation jig 10 includes: a frame 11 of a rod shape; a lower plate 12 provided at a lower end of the frame 11; an upper plate 13 provided at an upper end of the frame 11; a sensor 14 fixed on the upper plate 13; a lamp 15 serving as a notification device such as a light emitting diode (LED) and configured to change the display according to the result detected by the sensor 14; and a battery box 16 containing a battery for operating the lamp 15. The frame 11, the lower plate 12 and the upper plate 13 are fixed by a fastener such as bolts and pins.

The lower plate 12 is provided with a reference surface 12a on an upper surface thereof. The reference surface 12a makes contact with a lower end surface 209b of the lower flange of the manifold 209. For example, the reference surface 12a according to the embodiments is made of a low dust generation material (for example, a fluororesin such as polytetrafluoroethylene) that hardly generates particles even when rubbed against a metal. The reference surface 12a makes contact only with the lower end surface 209b and does not contact an inner peripheral surface of the manifold 209. It is sufficient for the reference surface 12a to maintain a constant position of the lower plate 12 in the vertical direction with reference to the lower end surface 209b of the manifold 209. That is, the reference surface 12a may not be a flat surface, and the contact between the reference surface 12a and the lower end surface 209b may be made only at a single point as long as the position of the lower plate 12 can be determined in the vertical direction with reference to the lower end surface 209b. However, in order to prevent the nozzle installation jig 10 from swinging, it is preferable that the reference surface 12a makes contact with the lower end surface 209b at at least two points.

The frame 11 is fixed to the lower plate 12 and extends vertically upward with respect to the reference surface 12a. A length of the frame 11 corresponds to a length of the nozzle such as the first nozzle 233a in the vertical direction. For example, the frame 11 according to the embodiments is a circular tube or a square tube made of aluminum through which an electric cable described later is inserted.

The upper plate 13 is fixed to the frame 11. The upper plate 13 is provided with a contact surface 13a that makes contact with an inner surface of the reaction tube 203. The contact surface 13a may also be referred to as a "contact structure 13a". For example, the contact surface 13a according to the embodiments is made of a low dust generation material. It is sufficient that the contact surface 13a is configured to maintain a constant distance between the inner surface of the reaction tube 203 and the sensor 14 in a radial direction of the reaction tube 203. That is, the contact surface 13a may not be a flat surface, and the contact between the contact surface 13a and the inner surface of the reaction tube 203 may be made only at a single point as long as the distance between the inner surface of the reaction tube 203 and the sensor 14 can be determined. However, it is preferable that the contact surface 13a makes contact with the inner surface of the reaction tube 203 at at least two points, wherein a distance between each point and one side of the sensor 14 is substantially equal to a distance between each point and the other side of the sensor 14. In this case, the sensor 14 and two of the at least two points of the contact surface 13a form an isosceles triangle. When the nozzle such as the first nozzle 233a is arranged in one of the nozzle chambers, the two points of the contact surface 13a are separated from each other by a width wider than a width of each of the nozzle chambers such that the contact surface 13a makes contact with a cylindrical portion of the reaction tube 203. The contact surface 13a is not limited to the structure that protrudes outward in the radial direction of the reaction tube 203. For example, the contact surface 13a may extend in the direction perpendicular to the radial direction so as to make contact with the inner surface of the reaction tube 203.

The sensor 14 may be embodied by a contact type sensor configured to detect a position of the first nozzle 233a. For example, the sensor 14 includes a limit switch (now shown). The sensor 14 is fixed to the upper plate 13 so that a detector (or a lever) 17 faces the outside of the reaction tube 203. For example, the sensor 14 according to the embodiments includes a make contact configured to close a circuit thereof when a detection target approaches the detector 17 more than a predetermined value or contacts the detector 17 or when the detector 17 is displaced. That is, the sensor 14 may be embodied by a contact type sensor configured to be turned on and off according to a displacement amount of the detector 17. For example, the sensor 14 is configured to detect a relative position of the nozzle such as the first nozzle 233a with respect to an inner surface of the process vessel when the lower plate 12 is in contact with a lower end of a peripheral vicinity of a lower end opening of the process vessel and the upper plate 13 is in contact with the inner surface of the process vessel. The lamp 15 is configured to transmit, to the operator, a notification indicating a current detection state of the sensor 14 or the change of the detection state. While the above description is directed to an example in which the lamp 15 is configured to notify the operator of the current detection state of the sensor 14 or the change of the detection state by a visual display, the embodiments are not limited thereto. For example, instead of or in addition to the visual display, the current detection state of the sensor 14 or the change of the detection state may be notified using an audible notification. When the lamp 15 is constituted by the LED, it may face downward (that is, the LED is configured to emit the light downward) so that the operator can easily check a lighting state (for example, a turn-on state and a turn-off state) of the lamp 15. When a break contact is used instead of the make contact, the lamp 15 may also serve as the lighting. Alternatively, another LED that permanently keeps on may be provided for the lighting.

The battery box 16 is provided at a lower surface of the lower plate 12, and a sealed battery provided in the battery box 16 supplies the electric power to the lamp 15. That is, a circuit is constituted by the battery, the lamp 15 and the sensor 14 connected in series by the electric cable. By providing the battery box 16 at the lower plate 12, an upper side of the nozzle installation jig 10 is lighter than a lower side thereof and, and the nozzle installation jig 10 is less likely to fall over. As a result, the operator can easily handle the nozzle installation jig 10.

When attaching the first nozzle 233a to the manifold 209, the horizontal portion of the first nozzle 233a is inserted into the nozzle port 210 of the manifold 209 through the process chamber 201. Here, the first nozzle 233a is of an L-shape with the horizontal portion and the vertical portion. Since the vertical portion of the first nozzle 233a is formed to be extremely longer than the horizontal portion of the first nozzle 233a, the bent portion where the vertical portion and the horizontal portion intersect may easily be lowered. Therefore, it tends to tilt inward in the radial direction of the reaction tube 203. When the first nozzle 233a is properly installed, the vertical portion is separated from the inner wall of the reaction tube 203 by about several millimeters (mm).

Figure 5:
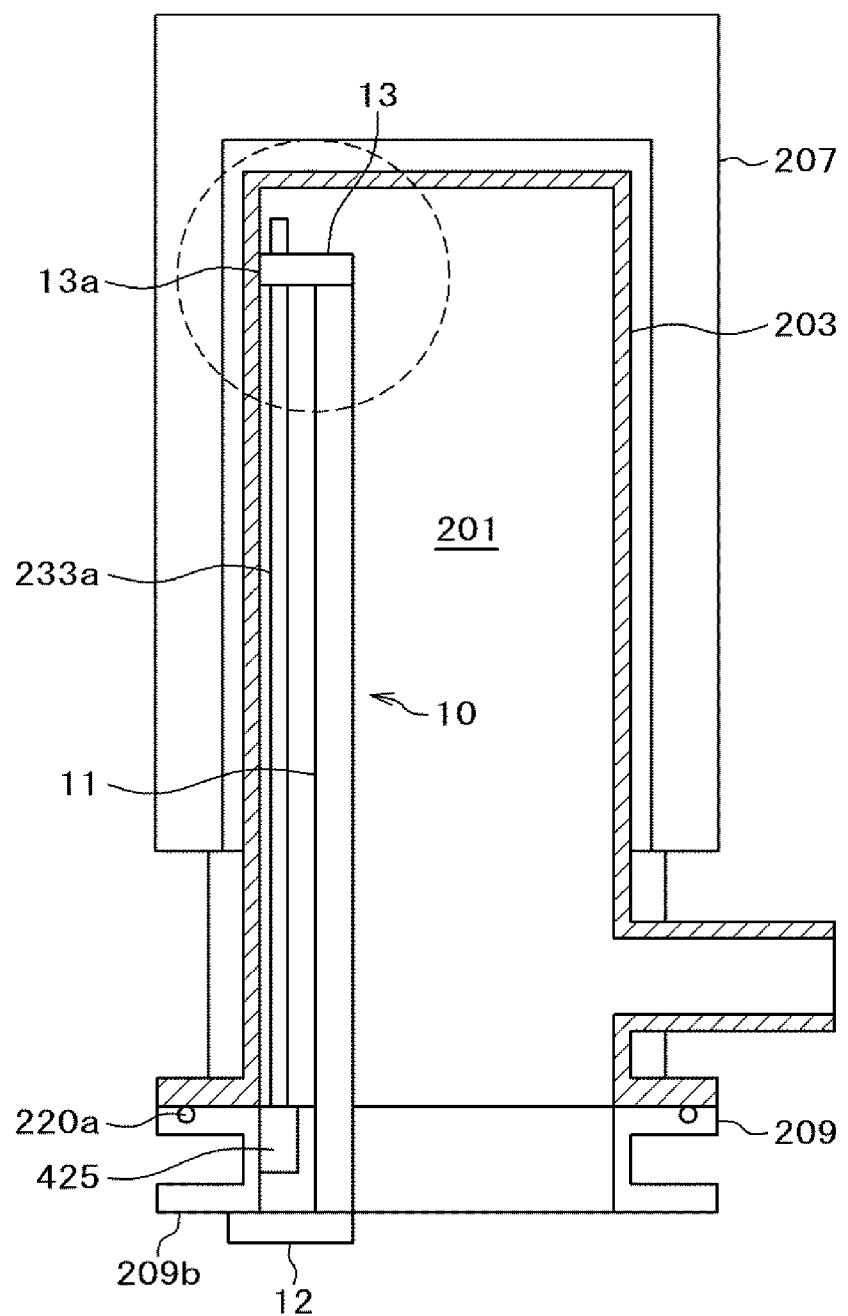
FIG. 5 schematically illustrates a vertical cross-section of the vertical type process furnace of the substrate processing apparatus when the nozzle installation jig according to the embodiments is installed in a reaction tube.

As shown in FIG. 5, the nozzle installation jig 10 is attached in the reaction tube 203 with the seal cap 219 lowered. When the nozzle installation jig 10 is being attached, the operator holds the lower plate 12 or the frame 11 while the reference surface 12a on the upper surface of the lower plate 12 is in contact with a lower surface of the manifold 209 directly below the first nozzle 233a. With the reference surface 12a in contact with the lower surface of the manifold 209 directly below the first nozzle 233a, the contact surface 13a on a side surface of the upper plate 13 is brought by the operator into contact with the inner surface of the reaction tube 203. The contact between the contact surface 13a and the inner surface of the reaction tube 203 is usually perceived by the touch or the sound. In such a state, the operator checks the lighting state of the lamp 15.

Figure 6A:
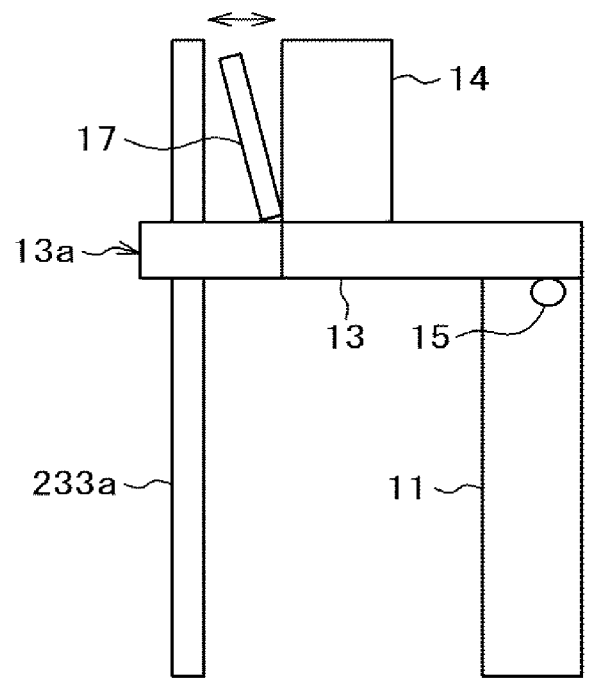
FIG. 6A schematically illustrates a side view of the nozzle installation jig when a position of the nozzle is proper.
Figure 6B:
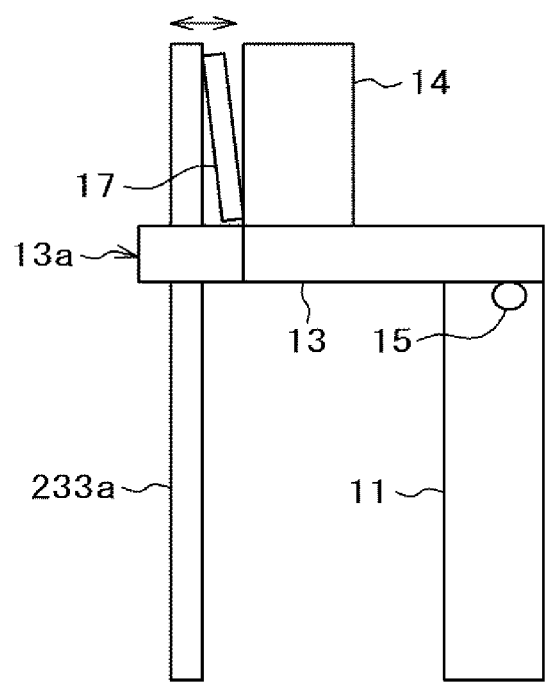
FIG. 6B is a side view of the nozzle installation jig when the position of the nozzle is not proper.

As shown in FIG. 6A, when the first nozzle 233a is tilted (or inclined) outward in the radial direction of the reaction tube 203 from a predetermined proper position, the first nozzle 233a and the detector 17 do not come into contact with each other, and the lamp 15 such as the LED is turned off. In addition, as shown in FIG. 6B, when the first nozzle 233a is tilted inward in the radial direction of the reaction tube 203 from the predetermined proper position, the first nozzle 233a and the detector 17 come into contact with each other, and the lamp 15 is turned on. The lamp 15 may also be turned on when the first nozzle 233a is farther from the inner surface of the reaction tube 203 than the predetermined proper position. This means that, when the lamp 15 is turned on, the position of the first nozzle 233a is not proper. Therefore, what the operator should do is to remove the nozzle installation jig 10 and adjust the tilt adjusting screw 422 so that the inward tilt (or the inclination) of the nozzle such as the first nozzle 233a is reduced. Then, the operator attaches the nozzle installation jig 10 again, and checks the lighting state of the lamp 15. The operation described above is performed repeatedly until the lamp 15 is turned off. On the other hand, when the lamp 15 is turned off in a first trial of the operation described above, this time the first nozzle 233a may be tilted outward from the predetermined proper position. In this case, the tilt adjusting screw 422 is adjusted repeatedly to tilt the nozzle inward until the turn-on of the lamp 15 is confirmed. Thereafter, the tilt adjusting screw 422 is adjusted once again so that the nozzle is tilted outward. Then, when it is confirmed that the lamp 15 is turned off, an operation of installing the nozzle installation jig 10 is completed.

Alternatively, the nozzle installation jig 10 may remain without being removed when adjusting the tilt adjusting screw 422, and may be temporarily fixed to the lower flange of the manifold 209 with a component such as a clamp. For such a case, the lower plate 12 is formed into a shape that does not interfere with the movement of a nozzle support 425 to a fixing structure. For example, the lower plate 12 is provided with a hole 12b (shown in FIG. 9) through which a screwdriver (not shown) is inserted. The screwdriver is used to tighten and loosen the tilt adjusting screw 422 such that the tilt adjusting screw 422 pushes up the bottom of the nozzle support 425 or the first nozzle 233a so as to correct the tilt in the radial direction of the reaction tube 203.

With the first nozzle 233a positioned by the nozzle installation jig 10, the horizontal portion of the first nozzle 233a is fixed to the joint 415 installed in the nozzle port 210. By fixing the horizontal portion to the joint 415, the first nozzle 233a is fixedly attached to the manifold 209 while a clearance between the first nozzle 233a and an inner peripheral surface of the process chamber 201 is maintained with the first nozzle 233a keeping in parallel with the inner peripheral surface of the process chamber 201.

According to the present embodiments, it is possible to provide at least one or more of the following effects.

(a) By inserting the horizontal portion of the nozzle into the nozzle port of the manifold using the nozzle installation jig and fixing the horizontal portion to the nozzle port, the nozzle can be fixed to the manifold while suppressing the inward tilt (inclination) of the nozzle in the radial direction of the reaction tube. Therefore, it is possible to properly fix the nozzle to the reaction tube.

(b) Since the nozzle can be properly fixed to the reaction tube, it is possible to prevent the nozzle from interfering with the reaction tube, the boat or the wafer, and it is also possible to prevent the nozzle, the reaction tube, the boat or the wafer from being damaged.

(c) Since the nozzle can be properly fixed to the reaction tube, it is possible to constantly maintain a film-forming stability which depends on the installation state of the nozzle.

(d) By using the nozzle installation jig that is attached not to the nozzle but to the reaction tube, the distance from the nozzle to the inner wall of the reaction tube can be easily grasped near a front end of the nozzle even when the nozzle is long and the front of the nozzle is out of reach of the operator. Therefore, the nozzle can be properly fixed to the reaction tube even by working alone in a narrow space.

(e) By using the nozzle installation jig that is fixed not to the nozzle but to the reaction tube, the contact between the nozzle and the nozzle installation jig can be minimized. Therefore, it is possible to suppress the generation of the particles and scratches due to the strong contact or the rubbing.

Other Embodiments

While the technique is described in detail by way of the above-described embodiments, the above-described technique is not limited thereto. The above-described technique may be modified in various ways without departing from the gist thereof.

Figure 8:
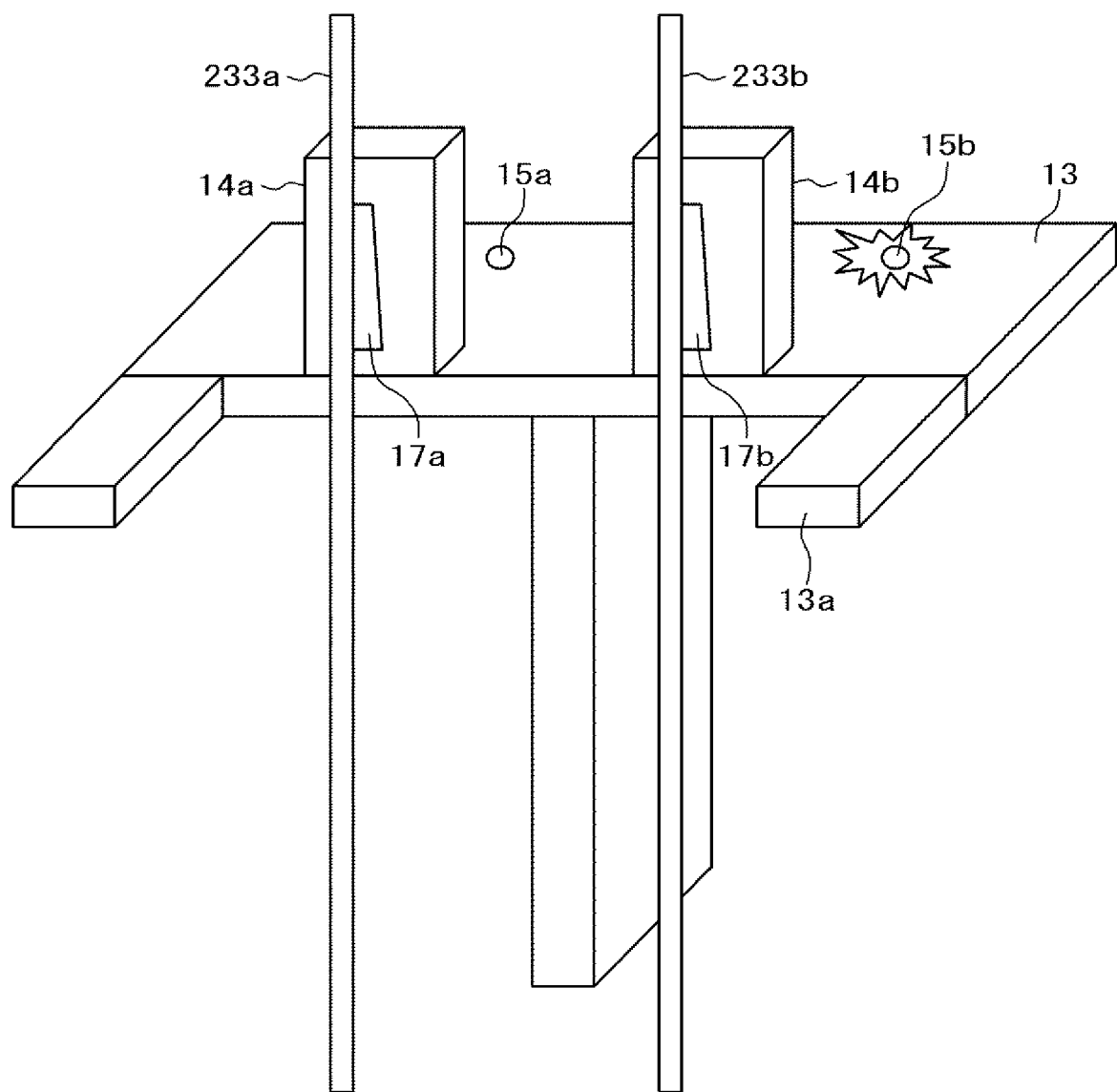
FIG. 8 schematically illustrates an enlarged view inside a broken line circle shown in FIG. 7.

For example, the embodiments are described by way of an example in which the sensor 14 and the lamp 15 are installed on the upper plate 13 of the nozzle installation jig 10. However, the technique is not limited thereto. For example, as shown in FIG. 8, a plurality of sensors (also simply referred to as "sensors") 14a and 14b and a plurality of lamps (also simply referred to as "lamps") 15a and 15b may be installed on the upper plate 13 of the nozzle installation jig 10.

Figure 7:
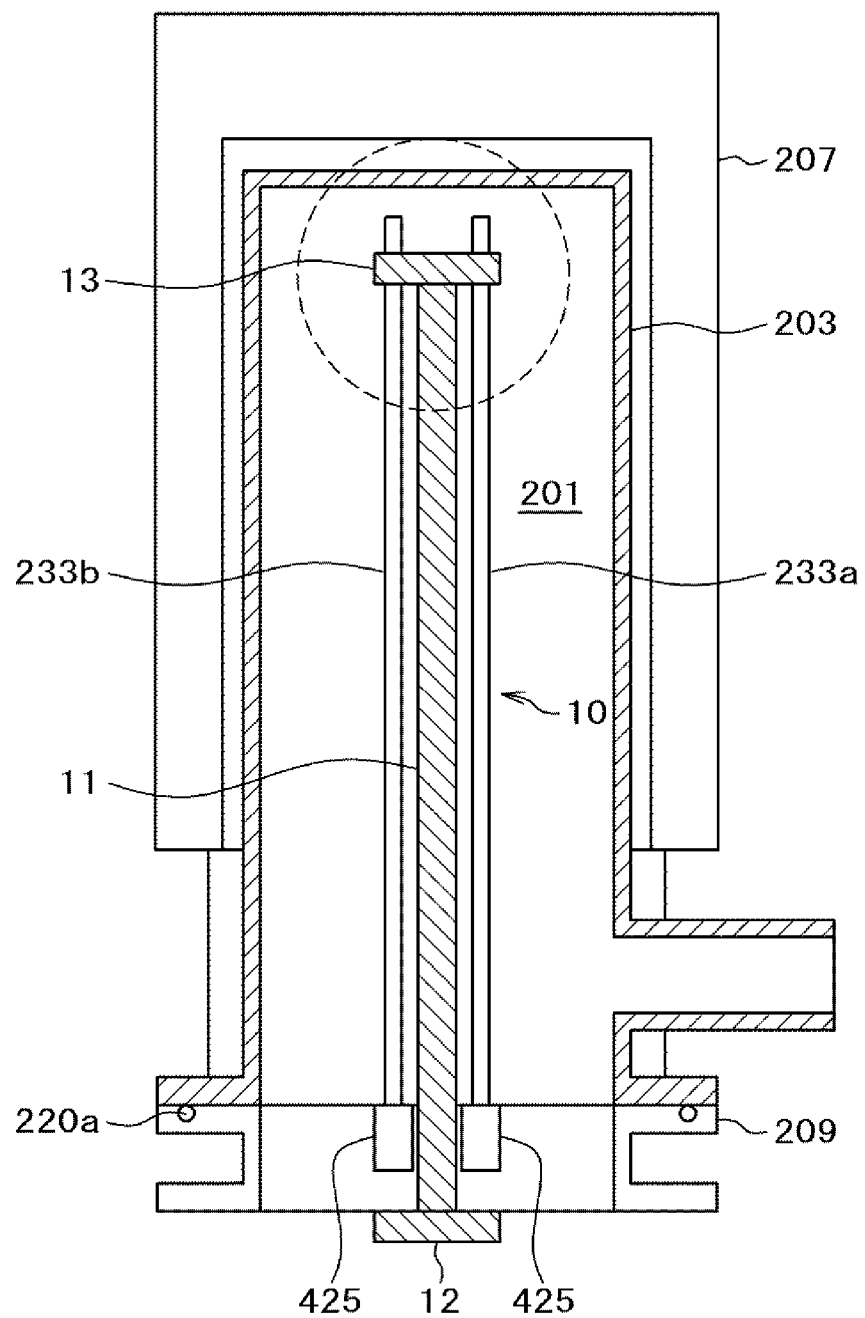
FIG. 7 schematically illustrates a vertical cross-section of the vertical type process furnace of the substrate processing apparatus when a nozzle installation jig according to a modified example of the embodiments is installed in the reaction tube.

Similar to the above-described embodiments, as shown in FIG. 7, the nozzle installation jig 10 is attached in the reaction tube 203 with the seal cap 219 lowered. When the nozzle installation jig 10 is attached, the frame 11 is held, the reference surface 12a on the upper surface of the lower plate 12 is brought into contact with the lower surface of the manifold 209, and the contact surface 13a on the side surface of the upper plate 13 is brought into contact with the inner surface of the reaction tube 203. In such a state, the sensors 14a and 14b detect the positions of the first nozzle 233a and the second nozzle 233b in the radial direction of the reaction tube 203, respectively. Since the sensor 14a and the lamp 15a of the first nozzle 233a are independent from the sensor 14b and the lamp 15b of the second nozzle 233b, it is possible to determine whether or not the position of each nozzle is proper. It is preferable that the lamps 15a and 15b are lit in different colors.

Alternatively, both of the sensors 14a and 14b may detect the position of the first nozzle 233a. For example, by arranging the sensors 14a and 14b orthogonal to each other, it is possible to detect and notify the position of the first nozzle 233a both in the radial direction and in a circumferential direction. Each of the sensors 14a and 14b is not limited to a contact type sensor. For example, a well-known detector such as an optical (non-contact type) distance sensor may be used as each of the sensors 14a and 14b.

For example, the embodiments are described by way of an example in which the lower plate 12 makes contact only with the lower end surface 209b of the manifold 209. However, the technique is not limited thereto. For example, the lower plate 12 may make contact with the manifold 209 or a lower inner peripheral surface of the reaction tube 203. As a result, even when the lower plate 12 is not strongly pressed directly upward, the lower plate 12 is less likely to deviate, so that the burden on the operator can be reduced. A contact surface with the lower inner peripheral surface of the reaction tube 203 can be implemented by forming a step on the lower plate 12 that makes contact with a corner of an opening of the lower end surface 209b.

Figure 9:
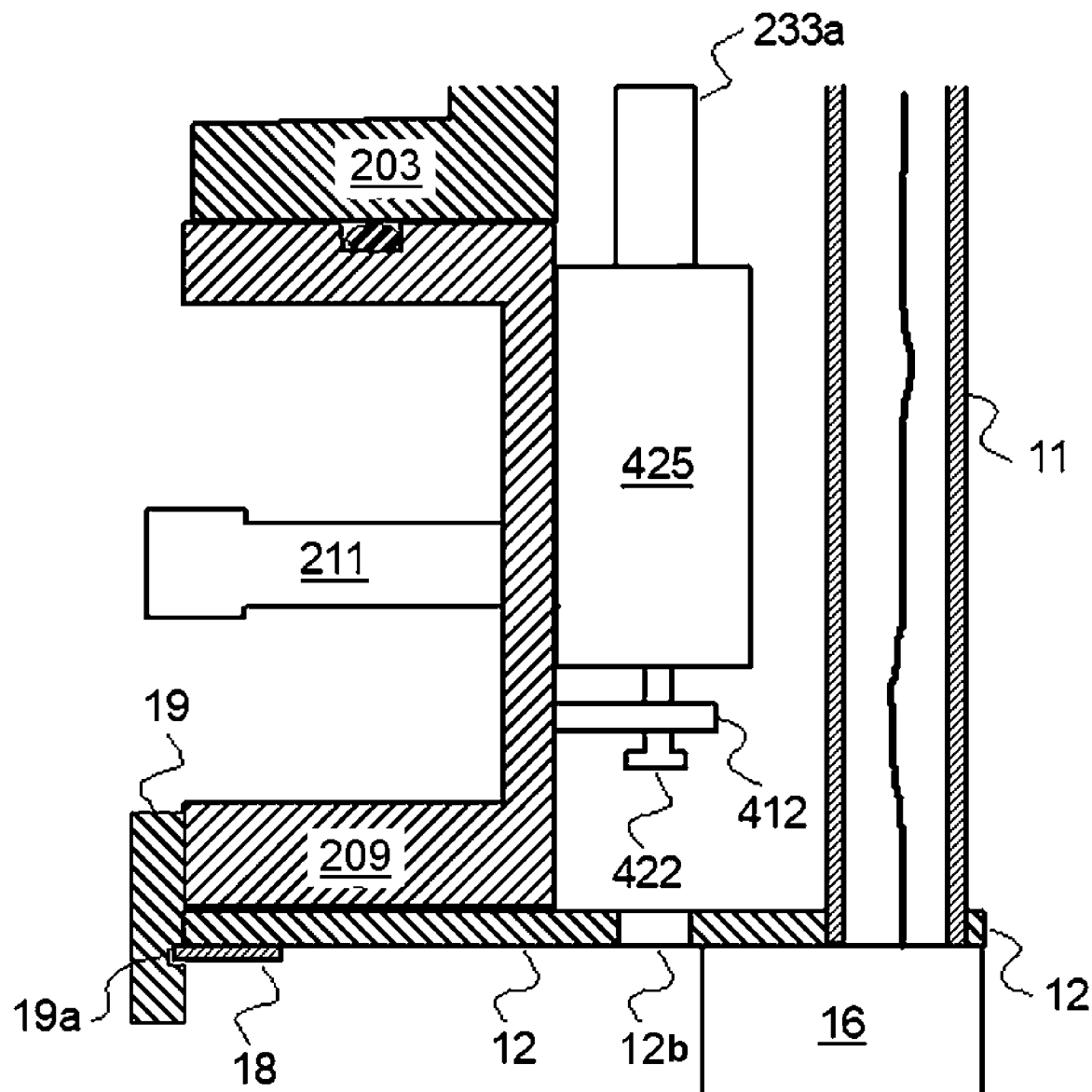
FIG. 9 schematically illustrates a vertical cross-section of the vertical type process furnace of the substrate processing apparatus when a nozzle installation jig according to another modified example of the embodiments is installed in the reaction tube.

For example, in order to determine the position of the lower plate 12 in the radial direction, the lower plate 12 may be provided with an engaging structure 18 that engages with a positioning structure provided on a lower surface or an outer peripheral surface of the lower flange of the manifold 209. As shown in FIG. 9, for example, a block 19 extending downward from the lower surface of the lower flange is temporarily or permanently provided on the outer peripheral surface of the lower flange of the manifold 209. By bringing the lower plate 12 into contact with the block 19, the lower plate 12 is positioned in the radial direction. Further, the block 19 includes a recess (which is a concave portion) 19a serving as a positioning structure on a surface thereof by making contact with the lower plate 12. By engaging the engaging structure 18 provided at a front end of the lower plate 12 with the recess 19a, the lower plate 12 is also positioned in the vertical direction, and what the operator should do is simply to push up the frame diagonally upward with a force that does not cause the frame to fall inward in the radial direction.

Alternatively, a recess serving as a positioning structure may provided on an outer peripheral side of the lower end surface of the lower flange of the manifold 209 that lies outer than the position where the lower flange of the manifold 209 makes contact with the O-ring 220b, and a protrusion (which is a convex portion) serving as an engaging structure may be provided at the corresponding position of the lower plate 12.

For example, the embodiments are described by way of an example in which the substrate processing apparatus including the vertical type process furnace is used. However, the technique is not limited thereto. For example, the technique may also be preferably applied when a single type substrate processing apparatus, a substrate processing apparatus including a hot wall type process furnace or a substrate processing apparatus including a cold wall type process furnace is used.

According to some embodiments of the technique in the present disclosure, it is possible to properly attach the nozzle to the reaction tube.

What is claimed is:

1. A nozzle installation jig comprising:
   a lower plate configured to make contact with a process vessel in a vicinity of a lower end opening of the process vessel in which a nozzle is provided;
   a frame fixed to the lower plate and extending upward with respect to the lower plate;
   an upper plate fixed to the frame and provided with at least one sensor configured to detect a position of the nozzle in the process vessel; and
   a notification device configured to transmit a notification to an operator according to a detection result of the at least one sensor.

2. The nozzle installation jig of claim 1, wherein the lower plate is provided with a reference surface configured to make contact with a peripheral vicinity of the lower end opening of the process vessel.

3. The nozzle installation jig of claim 2, wherein the at least one sensor is configured to detect the position of the nozzle in a radial direction of the process vessel while the lower plate is in contact with a lower end of the peripheral vicinity of the lower end opening of the process vessel.

4. The nozzle installation jig of claim 1, wherein the notification device is fixed to the upper plate.

5. The nozzle installation jig of claim 4, wherein the notification device comprises a lamp configured to emit a light downward.

6. The nozzle installation jig of claim 4, wherein the upper plate is provided with a contact structure made of a fluororesin such that at least two points on the contact structure are configured to make contact with the inner surface of the process vessel.

7. The nozzle installation jig of claim 6, wherein the at least two points of the contact structure are separated from each other by a width wider than a width of a nozzle chamber of the process vessel, and the contact structure is configured to make contact with a cylindrical portion of the process vessel.

8. The nozzle installation jig of claim 1, wherein a length of the frame corresponds to a length of the nozzle in a vertical direction.

9. The nozzle installation jig of claim 1, wherein the at least one sensor is configured to detect a relative position of the nozzle with respect to an inner surface of the process vessel while the lower plate is in contact with a lower end of a peripheral vicinity of the lower end opening of the process vessel and the upper plate is in contact with the inner surface of the process vessel.

10. The nozzle installation jig of claim 1, wherein the at least one sensor comprises a contact type sensor configured to be turned on and off according to a displacement amount of a detector.

11. The nozzle installation jig of claim 10, wherein the notification device is turned on when the nozzle is farther from an inner surface of the process vessel than a predetermined position or when the nozzle is tilted inward in a radial direction of the process vessel.

12. The nozzle installation jig of claim 1, wherein the at least one sensor comprises a plurality of sensors, the notification device comprises a plurality of notification devices, the plurality of the sensors are configured to detect positions of a plurality of nozzles arranged adjacent to each other in the process vessel, respectively, and the plurality of the notification devices are configured to light in different colors.

13. The nozzle installation jig of claim 1, wherein the lower plate is provided with a hole through which a screwdriver is inserted, and the screwdriver is configured to tighten and loosen a tilt adjusting screw configured to correct a tilt of the nozzle.

14. The nozzle installation jig of claim 1, wherein the lower plate is configured to make contact with an inner surface of the process vessel in a vicinity of a lower end of the process vessel.

15. The nozzle installation jig of claim 1, wherein the lower plate is provided with a step configured to make contact with a corner of the lower end opening of the process vessel.

16. The nozzle installation jig of claim 1, wherein the lower plate is provided with an engaging structure configured to engage with a positioning structure provided on a lower surface or an outer peripheral surface of a flange defining the lower end opening of the process vessel.

* * * * *